United States Patent
Hsu

(10) Patent No.: US 6,346,445 B1
(45) Date of Patent: Feb. 12, 2002

(54) METHOD FOR FABRICATING SEMICONDUCTOR DEVICES WITH DUAL GATE OXIDES

(75) Inventor: Shih-Ying Hsu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/715,826

(22) Filed: Nov. 17, 2000

(51) Int. Cl.$^7$ .............................................. H01L 21/336
(52) U.S. Cl. ........................ 438/279; 438/286; 438/200; 438/981
(58) Field of Search ................... 438/200, 221, 438/258, 261, 263, 279, 283, 286, 299, 585, 587, 589, 594, 976, 981

(56) References Cited

U.S. PATENT DOCUMENTS

| | | | | |
|---|---|---|---|---|
| 5,923,984 A | * | 7/1999 | Gardner et al. | 438/289 |
| 6,025,234 A | * | 2/2000 | Chou | 438/279 |
| 6,200,834 B1 | * | 3/2001 | Bronner et al. | 438/142 |
| 6,235,585 B1 | * | 5/2001 | Lee et al. | 438/258 |

* cited by examiner

*Primary Examiner*—Charles Bowers
*Assistant Examiner*—Jack Chen
(74) *Attorney, Agent, or Firm*—Powell, Goldstein, Frazer & Murphy LLP

(57) ABSTRACT

A dual gate oxides' process for mixed-mode IC is provided. More particularly, the present invention relates to a dual gate oxides' process for mixed-mode IC, which protects and improves the dual gate oxides' quality.

37 Claims, 5 Drawing Sheets

METHOD FOR FABRICATING SEMICONDUCTOR DEVICES WITH DUAL GATE OXIDES

BACKGROUND OF THE INVENTION

1. Field of the Invention

The present invention relates to a dual gate oxides' process for mixed-mode IC. More particularly, the present invention relates to a dual gate oxides' process for mixed-mode IC, which protects and improves the dual gate oxides' quality.

2. Description of the Prior Art

The conventional mixed-mode IC includes embedded dynamic random access memory (embedded DRAM), embedded static random access memory (embedded SRAM) and application-specific integrated circuit (ASIC) In a mixed-mode IC there are at least two types of transistor devices, for example, memory devices and logic devices. For mixed-mode IC, each type of transistor device requires different gate operational voltages. Therefore, it is required to form different kinds of transistor devices with different gate oxide thickness on a same chip. For example, a device such as a memory device having a gate oxide thickness of about 50 angstroms, the gate operational voltage is about 25V. For a device such as a peripheral circuit device having a gate oxide thickness of about 70 angstroms, the gate operational voltage is about 33V. For a device such as a high voltage device having a gate oxide thickness of about 120 angstroms, the gate operational voltage is about 5.0V.

As shown in FIGS. 1A and 1B, the conventional process to make different gate oxide with different thickness on the same substrate comprises the steps for forming a first gate oxide layer 101 on a semiconductor substrate 100 through thermal oxidation, and then forming a photoresist 102 on the first gate oxide layer 101 while exposing a portion of the first gate oxide layer 101 then removing the exposed portion of the first gate oxide layer 101 by wet etching with buffered oxide etches (BOE) or HF dip etching. Then the photoresist 102 is stripped away. Thereafter, forming a second gate oxide layer 103 thinner than the first gate oxide layer 101 on the substrate 100 through thermal oxidation, upon the second gate oxide layer 103 growing, a gate oxide also grows on the first gate oxide layer 101 at a slower rate. Finally, the total thickness of the first gate oxide layer 101 is thicker than that of the second gate oxide layer 103.

The photoresist 102 can be stripped away by way of a wet stripping method utilizing an organic solution or an Inorganic solution, or a dry stripping method with oxygen plasma. However, the photoresist 102 is directly in contact with the first gate oxide layer 101, the photoresist 102 readily contaminates the first gate oxide layer 101, in spite of the process for stripping away the photoresist 102.

Accordingly, it is desirable to provide a method for forming a dual gate oxides' structure, which can overcome the drawback of the prior art and improve the dual gate oxides' quality.

SUMMARY OF THE INVENTION

It is one object of the present invention to provide a method for fabricating semiconductor devices with dual gate oxides which protect the dual gate oxides from coming directly in contact with a photoresist, and then avoiding the photoresist contamination on the dual gate oxides.

It is another object of the present invention to provide a method for fabricating semiconductor devices with dual gate oxides which improves the dual gate oxides' quality.

In order to achieve the above objects, the present invention provides a method for fabricating semiconductor devices with dual gate oxides. Firstly, a semiconductor substrate is provided followed by forming a first gate oxide on the substrate. Next, forming a first conductive layer on the first gate oxide, and then forming a photoresist on the first conductive layer while exposing a portion of the first conductive layer. Subsequently, removing the exposed portion of the first conductive layer and the first gate oxide thereunder. Thereafter, forming a second gate oxide thinner than the first gate oxide on the first conductive layer on the first gate oxide and on the substrate. Following, forming a second conductive layer on the second gate oxide and then forming a protecting layer on the second conductive layer. Defining a first active area over the second gate oxide on the substrate. After that, respectively, forming a trench between the first active area and the second active area and beside another respective side of the first active area and the second active area. Then, forming a dielectric layer over the first active area and the second active area to fill the trench. Planarizing the dielectric layer until exposing the second conductive layer over the first active area while the rest of the protecting layer is left on the second conductive layer of the second active area. Then, sequentially removing the exposed second conductive layer and the second gate oxide thereunder over the first active area. Subsequently, removing the rest of the protecting layer over the second active area. Finally, forming a third conductive layer over the substrate, and patterning the third conductive layer to respectively form a conductive gate on the second gate oxide of the second active area. Thereby, a dual gate oxides' structure is obtained. The first conductive layer and the second conductive layer are respectively formed on the first gate oxide and the second gate oxide, therefore, the first gate oxide and the second gate oxide are protected from coming directly in contact with the respective photoresist. And then, the photoresist contamination on the dual gate oxides is avoided.

BRIEF DESCRIPTION OF THE DRAWINGS

The present invention can be besst understood through the following description and accompanying drawings wherein.

DESCRIPTION OF THE EMBODIMENTS

Figure 1A:
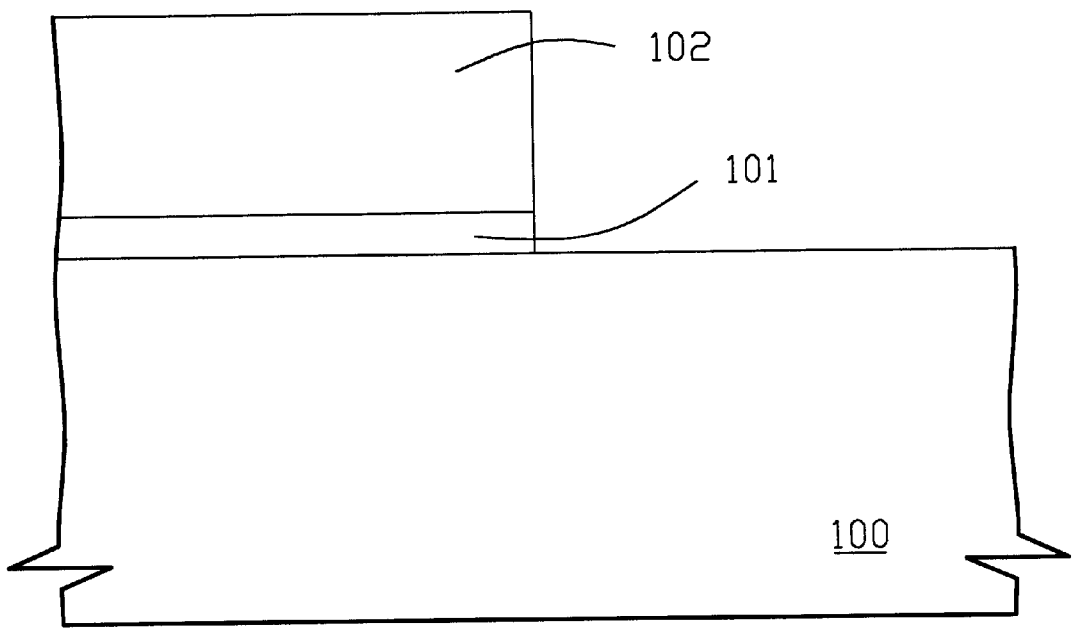
FIGS 1A and 1B depict cross-sectional views of various steps of the conventional process for forming a dual gate oxides' structure.
Figure 1B:
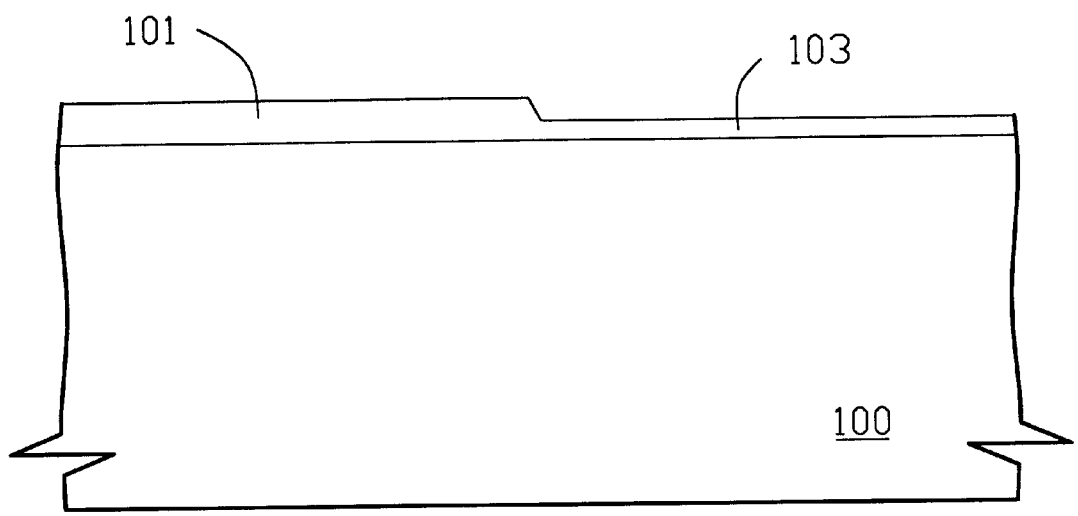
Figure 2:
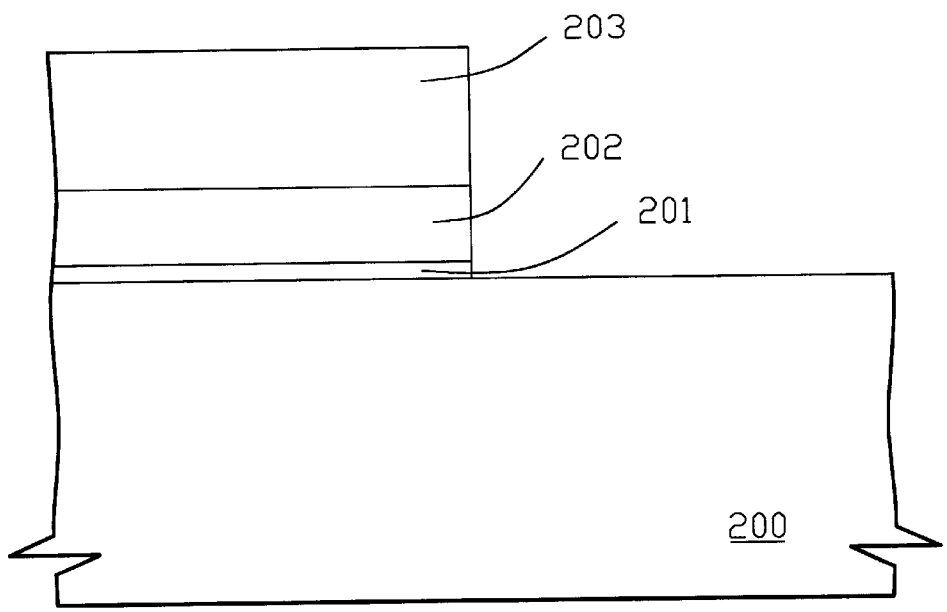
FIG. 2 to FIG. 8 depict cross-sectional views of various steps of a method for forming a dual gate oxides' structure according to one embodiment of the present invention.

Referring to FIG. 2, at first, providing a semiconductor substrate 200 and forming a first gate oxide layer 201 on the substrate 200 by way of thermal oxidation, such as dry thermal oxidation and wet thermal oxidation. Subsequently, forming a first conductive layer 202 with a thickness of about 300~500 angstroms on the first gate oxide layer 201. The first conductive layer 202 can be formed of polysilicon, by way of low pressure chemical vapor deposition utilizing $SiH_4$ as reaction gas at a temperature of 600~650° C. Forming a photoresist 203 on the first conductive layer 202 while exposing a portion of the first conductive layer 202. Then, removing the exposed portion of the first conductive layer 202 by way of reactive ion etching method, utilizing a source gas such as $Cl_2$, HCl and $SiCl_4$, when the first conductive layer 202 is formed of polysilicon. Subsequently, removing the first gate oxide layer 201 under the exposed portion of the first conductive layer 202, by way of reactive ion etching utilizing a gas such as $CF_4$, $CHF_3$, $C_2F_6$ and $C_3F_8$ as reaction gas or wet etching such as HF or BOE dip etching. Afterward, the photoresist 203 is stripped away by way of wet stripping with an organic solution or an inorganic solution, or dry stripping with oxygen plasma.

Figure 3:
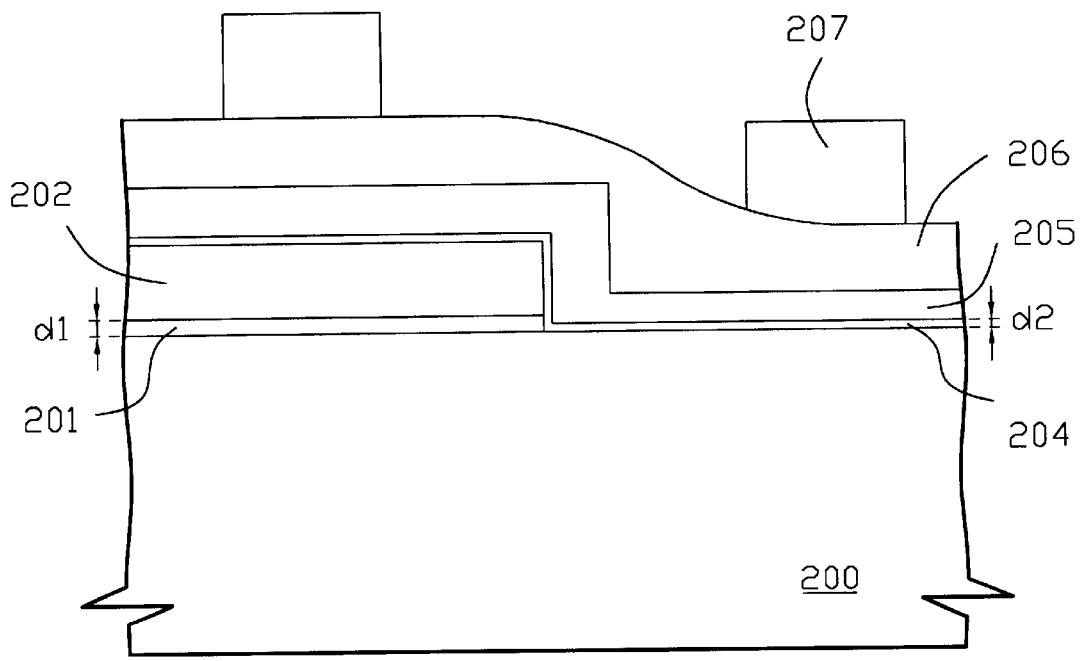

Referring to FIG. 3, subsequently, forming a second gate oxide layer 204 with a thickness $d_2$ thinner than the thickness $d_1$ of the first gate oxide layer 201 over the first conductive layer 202 on the first gate oxide layer 202 and over the substrate 200. The second gate oxide layer 204 can be formed by the same method with the first gate oxide layer 201. Thereafter, forming a second conductive layer 205 with a thickness about 300~500 angstroms on the second gate oxide layer 204. The second conductive layer 205 can be formed of polysilicon by way of low pressure chemical vapor deposition utilizing $SiH_4$ as reaction gas at a temperature of 600~650° C. Following, forming a protecting layer 206 with a thickness about 1500~2000 angstroms, such as a silicon nitride ($Si_3N_4$) layer on the second conductive layer 205. The protecting layer of silicon nitride 206 can be formed by way of low pressure chemical vapor deposition utilizing a mixture of $SiH_2Cl_2$ and $NH_3$ as reaction gas at an operational pressure about 0.1~1 torr and a temperature about 700~800° C., alternately by way of plasma enhanced chemical vapor deposition utilizing a mixture of $SiH_4$, $NH_3$ and $N_2$ as reaction gas at an operational pressure about 1~5 torr and a temperature about 250~400° C.

Figure 4:
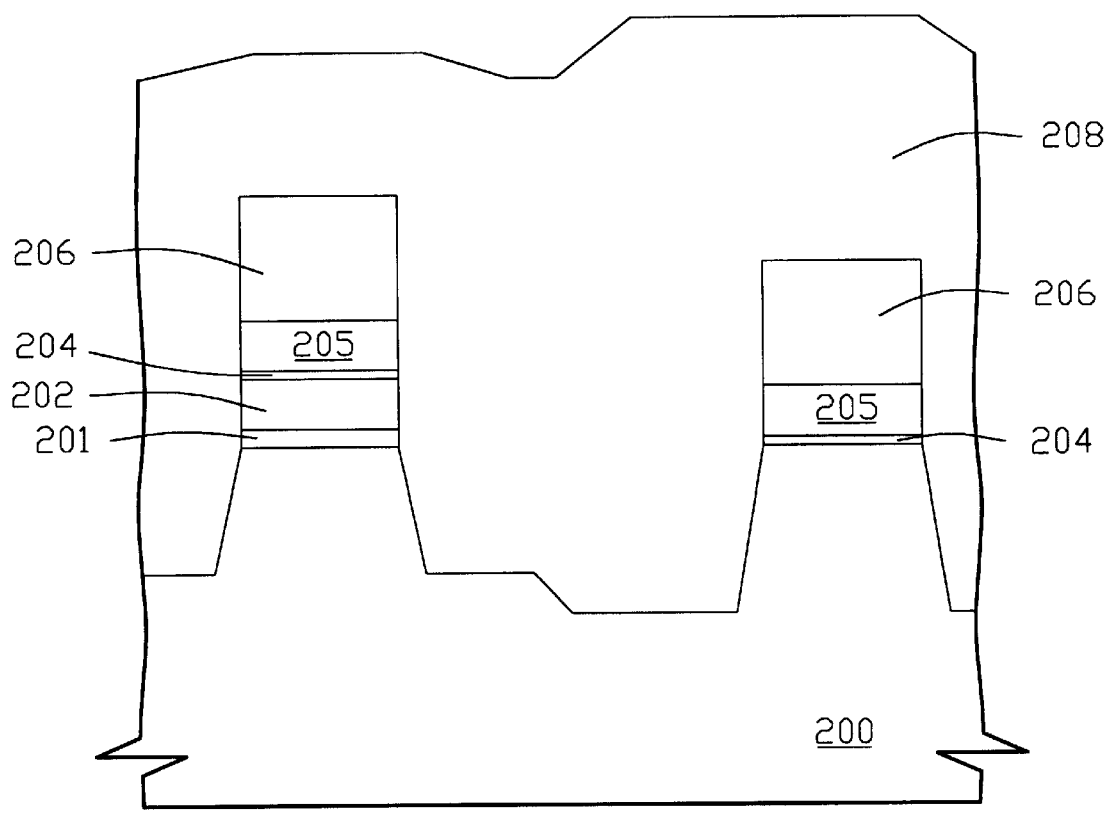

Subsequently, forming a photoresist 207 on the protecting layer 206 over the first gate oxide layer 201 and a photoresist 207 on the protecting layer 206 over the second gate oxide 204 on the substrate 200. Then, defining a first active area corresponding to the first gate oxide layer 201 and a second active area corresponding to the second gate oxide layer 204 on the substrate 200. Referring to FIG. 4, respectively forming a trench between the first active area and the second active area and beside another respective side of the first active area and the second active area by way of anisotropically etching, with a depth about 3000~4000 angstroms in the substrate 200. Afterward, forming a dielectric layer 208, such as a silicon dioxide layer and a spin-on glass layer, to fill the trench. In case that the dielectric layer 208 is formed of silicon dioxide, which can be formed by way of any kind of chemical vapor deposition and high density plasma chemical vapor deposition.

Figure 5:
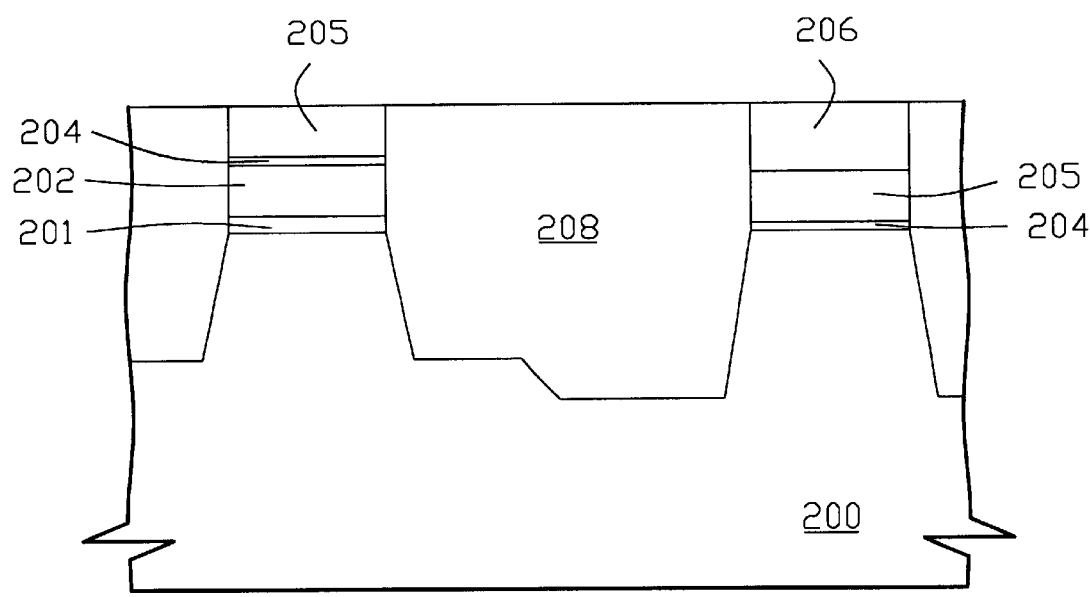
Figure 6:
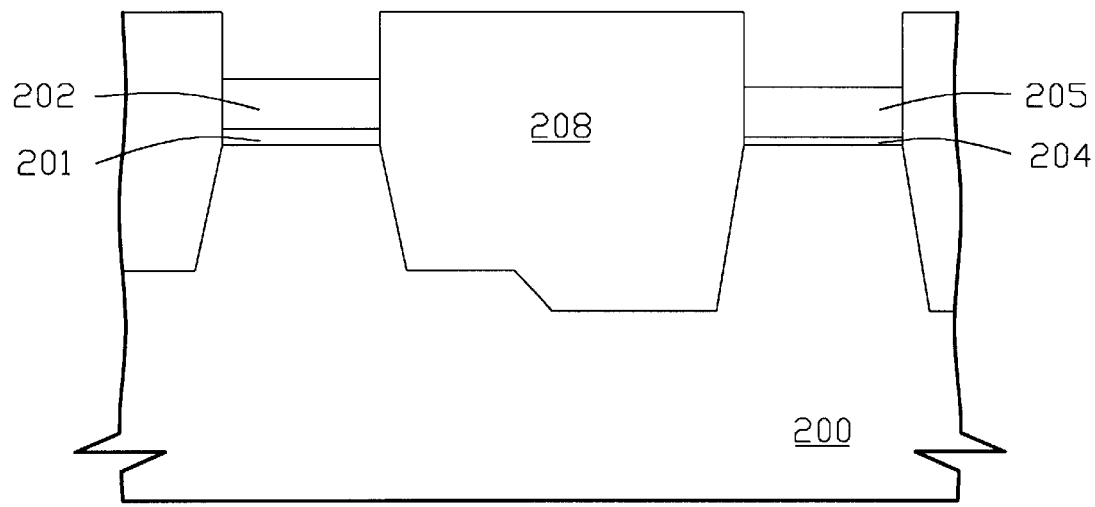

Referring to FIG. 5, planarizing the dielectric layer 208 by way of chemical mechanical polishing method until the second conductive layer 205 over the first conductive layer 201 of the first active area is exposed, while the rest of the protecting layer 206 is left on the second conductive layer 205 on the second gate oxide layer 204 of the second active area. Referring to FIG. 6, sequentially removing the second conductive layer 205 and the second gate oxide layer 204 thereunder over the first conductive layer 202 of the first active area. When the second conductive layer 205 is formed of polysilicon, which can be removed by way of reactive ion etching method utilizing a source gas such as $Cl_2$, $HC_1$ and $SiCl_4$, and alternately by way of wet etching with a mixture of $HNO_3$ aqueous solution and HF aqueous solution. While the second gate oxide layer 204 under the removed second conductive layer 205 is removed by way of wet etching with buffered oxide etches (BOE), and also can use 49 wt. % HF wet dip etching. Thereafter, removing the rest of protecting layer 206 on the second conductive layer 205 of the second active area. In case that the protecting layer 106 is formed of silicon nitride, the rest of the protecting layer of silicon nitride 206 on the second active area can be removed by way of wet etching utilizing $H_3PO_4$ aqueous solution with a concentration of about 86 wt. % at a temperature of about 150~180° C. While the rest of the protecting layer of silicon nitride 206 also can be removed by way of reactive ion etching utilizing a gas such as $CF_4$, $CHF_3$, $C_2F_6$ and $C_3F_8$ as reaction gas.

Figure 7:
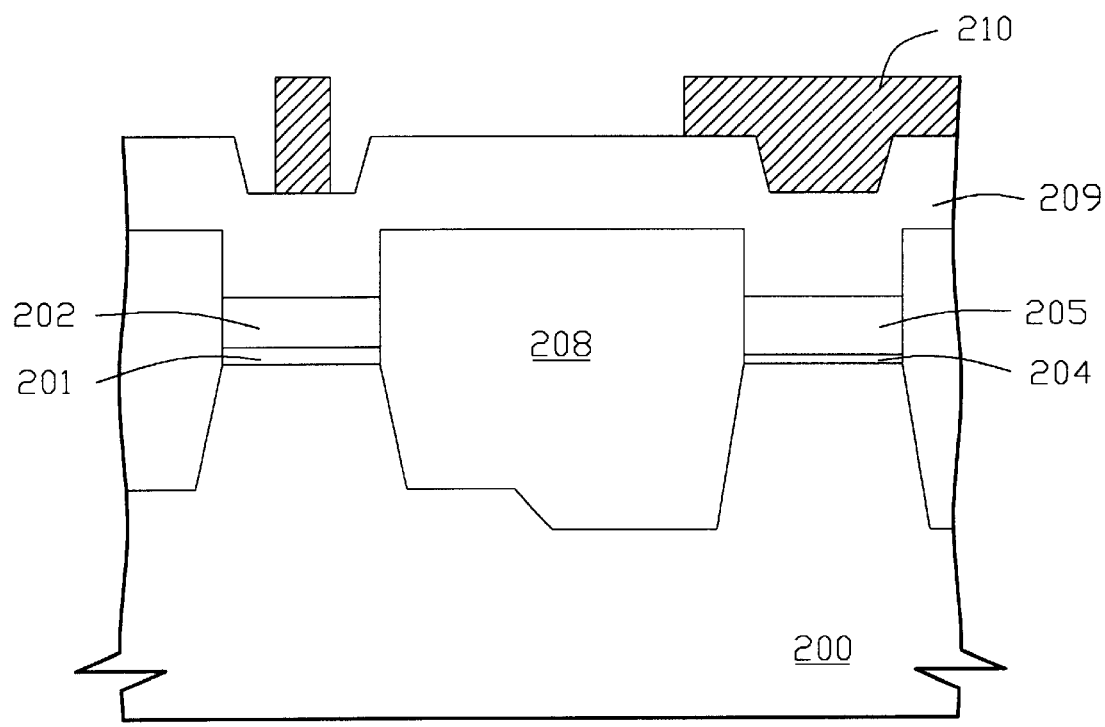
Figure 8:
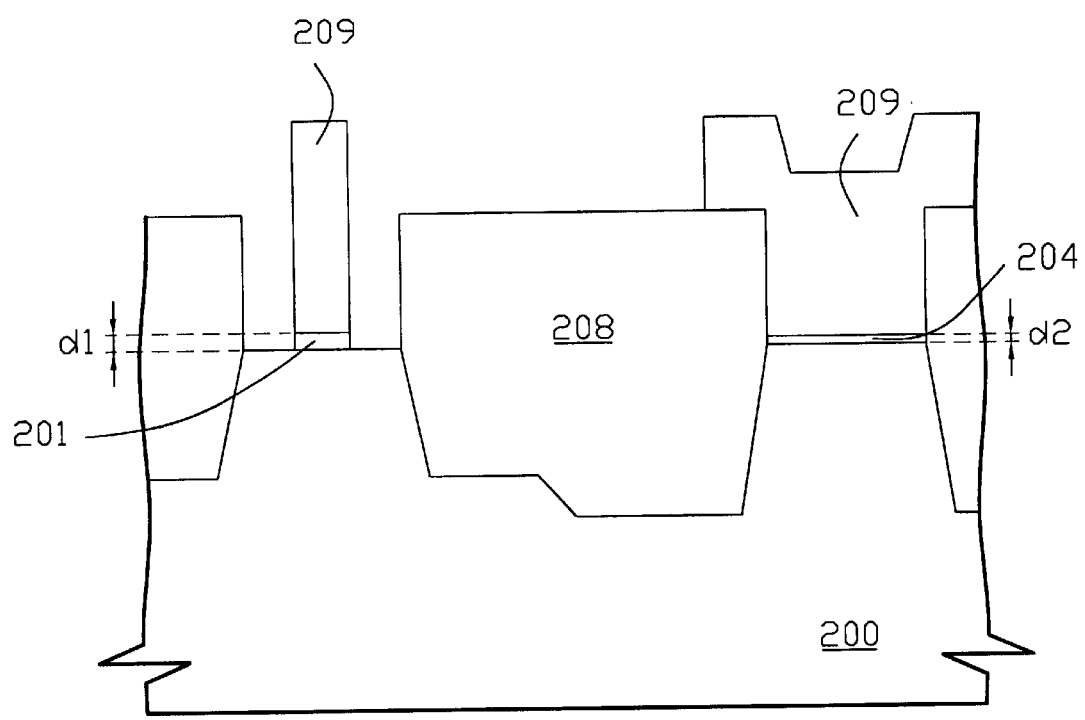

Referring to FIG. 7, forming a third conductive layer 209 over the first active area, the dielectric layer 208 and the second active area. The third conductive layer 209 can be formed of polysilicon by way of low pressure chemical vapor deposition utilizing $SiH_4$ as reaction gas at a temperature of about 600~650° C. Forming a photoresist 210 on the third conductive layer 209 of the first active area and a photoresist 210 on the third conductive layer 209 of the second active area. Then, defining a conductive gate 209 on the first gate oxide 201 with the thickness $d_1$ of the first active area and a conductive gate 209 on the second gate oxide 204 with a thickness $d_2$ of the second active area, as shown in FIG. 8. Thereby, a dual gate oxides' structure is provided on the same substrate.

In accordance with the forgoing, the first gate oxide layer 201 and the second gate oxide layer 204 are respectively protected by the first conductive layer 202 and the second conductive layer 205. The first gate oxide layer 201 and the second gate oxide layer 204 are not in contact with a photoresist directly, therefore, the photoresist contamination on the first gate oxide layer 201 and the second gate oxide layer 204 is avoided, and thus the quality of the dual gate oxides of the present invention is improved.

The embodiments are only used to illustrate the present invention, not intended to limit the scope thereof. Many modifications of the preferred embodiment can be made without departing from the spirit of the present invention.

What is claimed is:

1. A method for fabricating semiconductor devices with dual gate oxides, said method comprising:

provi ding a semiconductor substrate;

forming a first gate oxide on said semiconductor substrate;

forming a first conductive layer on said first gate oxide;

forming a photoresist on said first conductive layer while exposing a portion of said first conductive layer;

removing said exposed portion of said first conductive layer and said first gate oxide thereunder;

forming a second gate oxide on said first conductive layer on said first gate oxide and on said semiconductor substrate;

forming a second conductive layer on said second gate oxide;

forming a protecting layer on said second conductive layer;

defining a first active area over said second gate oxide above said first gate oxide and a second active area over said second gate oxide on said semiconductor substrate;

respectively forming a trench between said first active area and said second active area and beside another respective side of said first active area and said second active area;

forming a dielectric layer over said first active area and said second active area to fill said trench;

planarizing said dielectric layer until exposing said second conductive layer over said first active area while a rest of said protecting layer left on said second conductive layer of said second active area;

sequentially removing said exposed second conductive layer and said second gate oxide thereunder over said first active area;

removing said rest of said protecting layer over said second active area;

forming a third conductive layer over said semiconductor substrate; and patterning said third conductive layer to respectively form a conductive gate on said first gate oxide of said first active area and a conductive gate on said second gate oxide of said second active area.

2. The method of claim 1, wherein said first gate oxide is thicker than said second gate oxide.

3. The method of claim 1, wherein said first gate oxide is formed of silicon dioxide through thermal oxidation.

4. The method of claim 1, wherein said second gate oxide is formed of silicon dioxide through thermal oxidation.

5. The method of claim 1, wherein said first conductive layer is formed of polysilicon by way of low pressure chemical vapor deposition utilizing $SiH_4$ as reaction gas at a temperature of about 600~650° C.

6. The method of claim 1, wherein said second conductive layer is formed of polysilicon by way of low pressure chemical vapor deposition utilizing $SiH_4$ as reaction gas at a temperature of about 600~650° C.

7. The method of claim 1, wherein said third conductive layer is formed of polysilicon by way of low pressure chemical vapor deposition utilizing $SiH_4$ as reaction gas at a temperature of about 600~650° C.

8. The method of claim 1, wherein said protecting layer is formed of silicon nitride ($Si_3N_4$).

9. The method of claim 8, wherein said protecting layer of silicon nitride is formed by way of low pressure chemical vapor deposition utilizing a mixture of $SiH_2Cl_2$ and $NH_3$ as reaction gas at an operational pressure of about 0.1~1 torr and a temperature of about 700~800° C.

10. The method of claim 8, wherein said protecting layer of silicon nitride is formed by way of plasma enhanced chemical vapor deposition utilizing a mixture of $SiH_4$, $NH_3$ and $N_2$ as reaction gas at an operational pressure of about 1~5 torr and a temperature of about 250~400° C.

11. The method of claim 1, wherein said dielectric layer is formed of silicon dioxide by way of chemical vapor deposition.

12. The method of claim 1, wherein said dielectric layer is formed of silicon dioxide by way of high density plasma chemical vapor deposition (HDPCVD).

13. The method of claim 1, wherein said dielectric layer is formed of spin-on glass.

14. The method of claim 5, wherein said exposed portion of said first conductive layer of polysilicon is removed by way of reactive ion etching utilizing a gas selected from the group consisted Of $Cl_2$, HCl and $SiCl_4$ as a source gas.

15. The method of claim 1, wherein said first gate oxide under said exposed portion of said first conductive layer is removed by way of reactive ion etching (RIE) method utilizing a gas selected from the group consisted of $CF_4$, $CHF_3$, $C_2F_6$ and $C_3F_8$ as reaction gas.

16. The method of claim 1, wherein said dielectric layer is planarized by way of chemical mechanical polishing method.

17. The method of claim 6, wherein said exposed second conductive layer of polysilicon on said first active area is removed by way of wet etching utilizing a mixture of $HNO_3$ aqueous solution and HF aqueous solution.

18. The method of claim 6, wherein said exposed second conductive layer of polysilicon on said first active area is removed by way of reactive ion etching utilizing a gas selected from the group consisted of $Cl_2$, HCl and $SiCl_4$ as a source gas.

19. The method of claim 1, wherein said second gate oxide over said first active area is removed by wet etching utilizing buffered oxide etches (BOE).

20. The method of claim 1, wherein said second gate oxide over said first active area is removed by wet dip utilizing HF aqueous solution.

21. The method of claim 8, wherein said rest of said protecting layer of silicon nitride over said second active area is removed by way of wet etching utilizing $H_3PO_4$ aqueous solution with 86 wt. % concentration at a temperature of about 150~180° C.

22. The method of claim 8, wherein said rest of said protecting layer of silicon nitride over said second active area is removed by way of reactive ion etching utilizing a gas selected from the group consisted of $CF_4$, $CHF_3$, $C_2F_6$ and $C_3F_8$ as reaction gas.

23. A method for fabricating semiconductor devices with dual gate oxides, said method comprising:

providing a semiconductor substrate;

forming a first gate oxide on said semiconductor substrate;

forming a first polysilicon layer on said first gate oxide;

forming a photoresist on said first polysilicon layer while exposing a portion of said first polysilicon layer;

removing said exposed portion of said first polysilicon layer and said first gate oxide thereunder;

forming a second gate oxide on said first polysilicon layer on said first gate oxide and on said semiconductor substrate, wherein said second gate oxide is thinner than said first gate oxide;

forming a second polysilicon layer on said second gate oxide;

forming a silicon nitride layer as a protecting layer on said second polysilicon layer;

defining a first active area over said second gate oxide above said first gate oxide and a second active area over said second gate oxide on said semiconductor substrate;

respectively forming a trench between said first active area and said second active area and beside another respective side of said first active area and said second active area;

forming a silicon dioxide layer over said first active area and said second active area to fill said trench;

planarizing said silicon dioxide layer until exposing said second polysilicon layer over said first active area while a rest of said protecting layer of silicon nitride left on said second polysilicon layer of said second active area;

sequentially removing said exposed second polysilicon layer and said second gate oxide thereunder over said first active area;

removing said rest of said protecting layer of silicon nitride over said second active area;

forming a third polysilicon layer over said semiconductor substrate; and patterning said third polysilicon layer to respectively form a conductive gate on said first gate oxide of said first active area and a conductive gate on said second gate oxide of said second active area.

24. The method of claim 23, wherein said first gate oxide is formed of silicon dioxide through thermal oxidation.

25. The method of claim 23, wherein said second gate oxide is formed of silicon dioxide through thermal oxidation.

26. The method of claim 23, wherein said silicon dioxide layer is formed by way of chemical vapor deposition.

27. The method of claim 23, wherein said silicon dioxide layer is formed by way of high density plasma chemical vapor deposition (HDPCVD).

28. The method of claim 23, wherein said silicon dioxide layer is formed of spin-on glass.

29. The method of claim 23, wherein said exposed portion of said first polysilicon layer is removed by way of reactive ion etching utilizing a gas selected from the group consisted of $Cl_2$, HCl and $SiCl_4$ as a source gas.

30. The method of claim 23, wherein said first gate oxide under said exposed portion of said first polysilicon layer is removed by way of reactive ion etching (RIE) method utilizing a gas selected from the group consisted of $CF_4$, $CHF_3$, $C_2F_6$ and $C_3F_8$ as reaction gas.

31. The method of claim 23, wherein said silicon dioxide layer is planarized by way of chemical mechanical polishing method.

32. The method of claim 23, wherein said exposed second polysilicon layer on said first active area is removed by way of wet etching utilizing a mixture of $HNO_3$ aqueous solution and HF aqueous solution.

33. The method of claim 23, wherein said exposed second polysilicon layer on said first active area is removed by way of reactive ion etching utilizing a gas selected from the group consisted of $Cl_2$, HCl and $SiCl_4$ as a source gas.

34. The method of claim 23, wherein said second gate oxide over said first active area is removed by wet etching utilizing buffered oxide etches (BOE).

35. The method of claim 23, wherein said second gate oxide over said first active area is removed by wet dip utilizing HF aqueous solution.

36. The method of claim 23, wherein said rest of said protecting layer of silicon nitride over said second active area is removed by way of wet etching utilizing $H_3PO_4$ aqueous solution with 86 wt. % concentration at a temperature of about 150~180° C.

37. The method of claim 23, wherein said rest of said protecting layer of silicon nitride over said second active area is removed by way of reactive ion etching utilizing a gas selected from the group consisted of $CF_4$, $CHF_3$, $C_2F_6$ and $C_3F_8$ as reaction gas.

* * * * *